(12) United States Patent
Kang et al.

(10) Patent No.: US 7,834,119 B2
(45) Date of Patent: Nov. 16, 2010

(54) ORGANIC SILICATE POLYMER AND INSULATION FILM COMPRISING THE SAME

(75) Inventors: Jung-Won Kang, Seoul (KR); Min-Jin Ko, Daejeon (KR); Dong-Seok Shin, Seoul (KR); Gwi-Gwon Kang, Seoul (KR); Myung-Sun Moon, Daejeon (KR); Hye-Yeong Nam, Cheongju (KR); Bum-Gyu Choi, Daejeon (KR); Young-Duk Kim, Daejeon (KR); Byung-Ro Kim, Daejeon (KR); Won-Jong Kwon, Daejeon (KR); Sang-Min Park, Daejeon (KR)

(73) Assignee: LG Chem, Ltd. (KR)

( * ) Notice: Subject to any disclaimer, the term of this patent is extended or adjusted under 35 U.S.C. 154(b) by 812 days.

(21) Appl. No.: 10/511,639

(22) PCT Filed: Mar. 28, 2003

(86) PCT No.: PCT/KR03/00634

§ 371 (c)(1),
(2), (4) Date: Nov. 28, 2005

(87) PCT Pub. No.: WO03/104305

PCT Pub. Date: Dec. 18, 2003

(65) Prior Publication Data

US 2007/0088144 A1    Apr. 19, 2007

(30) Foreign Application Priority Data

Apr. 18, 2002  (KR) ............... 10-2002-0021140
Apr. 18, 2002  (KR) ............... 10-2002-0021141

(51) Int. Cl.
C08G 77/04    (2006.01)
(52) U.S. Cl. .......................... 528/37; 528/34
(58) Field of Classification Search ............ 528/14, 528/10–12, 33–34, 21, 23, 17–18, 37; 525/478
See application file for complete search history.

(56) References Cited

U.S. PATENT DOCUMENTS

| 4,618,665 A | * | 10/1986 | Braun et al. | 528/25 |
| 5,548,053 A | | 8/1996 | Weidner et al. | 528/14 |
| 5,656,555 A | | 8/1997 | Cho | 438/760 |
| 6,639,015 B1 | * | 10/2003 | Nakashima et al. | 525/106 |
| 7,071,277 B2 | * | 7/2006 | Kennedy et al. | 528/15 |
| 7,358,316 B2 | * | 4/2008 | Ko et al. | 528/12 |
| 2001/0053840 A1 | | 12/2001 | Ko et al. | |

FOREIGN PATENT DOCUMENTS

| GB | 627800 | | 8/1949 |
| GB | 632955 | | 12/1949 |
| GB | 746193 | | 3/1956 |
| GB | 2 125 423 A | | 3/1984 |
| JP | 5-295270 | | 11/1993 |
| JP | 6-248085 | | 9/1994 |
| JP | 07502779 | | 3/1995 |
| JP | 2000309753 | | 11/2000 |
| WO | WO0012640 | * | 3/2000 |
| WO | WO0222710 | * | 3/2002 |

OTHER PUBLICATIONS

Salamone. Joseph C.,Polymeric Materials Encyclopedia, Jul. 23, 1996,CRC, 1 edition, p. 725. (Synthesis of Silanol).*
Hardman et al. (Siicones, Encyclopedia of Polymer Science and Engineering, 2$^{nd}$ Ed., John Wiley & Sons, Inc. vol. 15, 1989, p. 252.*
JP Application No. 2004-511371 Office Action dated Apr. 3, 2007, 3 pages.
TW Search Report, TW Application No. 092107963; one page.
TW Application No. 092107963 Office Action; dated Feb. 5, 2007, 3 pages.

* cited by examiner

*Primary Examiner*—Kuo-Liang Peng
(74) *Attorney, Agent, or Firm*—Cantor Colburn LLP

(57) ABSTRACT

The present invention relates to an organic silicate polymer prepared by mixing silane compound with organic solvent to prepare a first mixture, and hydrolyzing and condensing the first mixture by adding water and catalyst, the first mixture being selected from a group consisting of oxidized hydrosilane, cyclic siloxane, a second mixture of oxidized hydrosilane and silane or silane oligomer, and a third mixture of cyclic siloxane and silane or silane oligomer, a composition for forming an insulation film of semiconductor devices prepared by using the organic silicate polymer, a method for preparing an insulation film using the composition, and a semiconductor device comprising the insulation film.

5 Claims, No Drawings

ORGANIC SILICATE POLYMER AND INSULATION FILM COMPRISING THE SAME

BACKGROUND OF THE INVENTION (a) Field of the Invention

The present invention relates to an organic silicate polymer having superior mechanical property and low dielectric property, and more particularly to a method for preparing organic silicate polymer having superior mechanical property and low dielectric property, an organic silicate polymer prepared therefrom, a composition for forming insulation film of semiconductor devices, a method for preparing insulation film using the composition, and a semiconductor device comprising the insulation film.

(b) Description of the Related Art

As the degree of integrity of semiconductor devices has been increased, linewidth of conducting wires that connect the devices has been rapidly reduced. In the year 2003, it is expected that high-density devices using 0.1 μm will be developed.

Generally, the speed of semiconductor devices is proportional to switching rate of transistors and signal transfer rate. The signal transfer rate is determined by the RC (Resistance-Capacitance) delay, which is the product of resistance of a wiring material and capacitance of an insulation film in semiconductor devices. With the increase of degree of integrity of semiconductor devices, gaps between metal wires inside the devices become narrow. Also, while thickness of the metal wires becomes small, their lengths increases rapidly. And, the speed of high-density chips is mainly determined by the RC delay rather than by the switching rate. Accordingly, High-speed chips employ conductors having low resistance and insulators having low dielectric constant. In addition, the chips employing the materials having low dielectric constant prevent power consumption and cross-talk between the metal wires.

Recently, International Business Machines Corporation has released semiconductor products using copper wires instead of conventional aluminum wires. The new products offer more than 20% of speed improvement. Semiconductor devices using the materials having low dielectric constant, however, are not on the market, due to the lack of suitable materials.

Most of the conventional semiconductor devices like ICs and LSIs use $SiO_2$ as insulators. The dielectric constant of $SiO_2$ is 4.0. And, fluorine-doped silicate ($F-SiO_2$), which has lower dielectric constant, is used for some devices. However, if the fluorine content of $F-SiO_2$ is larger than 6%, it becomes thermally unstable. Therefore, it is difficult to lower the dielectric constant of $F-SiO_2$ below 3.5. In order to solve this problem, many organic and inorganic polymers thermally stable and having low polarity have been proposed.

For organic polymers having low dielectric constant, polyimide resin, polyarylene ether resin and resin containing aromatic hydrocarbon or perfluorocyclobutane are known. These resins may or may not contain fluorine. While most of these organic polymers have dielectric constant lower than 3.0, they have poor elasticity at high temperature due to low glass transition temperature, and very high linear expansion coefficients. In particular, these problems are more severe in the fluorine-containing organic polymers. Because high temperature of 200° C. to 450° C. is associated with semiconductor manufacturing and packaging processes, organic polymers having poor thermal stability and elasticity and high linear expansion coefficient may deteriorate reliability of semiconductor devices or circuit boards.

Recently, organic silicate polymers using alkoxy silanes have been developed to solve the thermal stability problem. The organic silicate polymers are formed by hydrolyzing, condensing and hardening organic silanes. The organic silicate polymers, for example, methylsilsesquioxane and hydrosilsesquioxane have rather low dielectric constant below 3.0 and are thermally stable at 450° C. However, these polysilsesquioxanes are vulnerable to cracks if the thickness of these polymers is larger than 1 μm due to the condensation stress during the hardening process. Also, while these polysilsesquioxanes have relatively higher mechanical strength than that of organic polymers, additional processing to reduce the dielectric constant below 2.5 lowers the mechanic property.

Therefore, organic silicate having low dielectric constant and superior mechanic property is needed.

SUMMARY OF THE INVENTION

The present invention provides a material having low dielectric constant that can be used for an insulation film, which is capable of offering high speed to semiconductor devices, lowering power consumption and greatly reducing cross-talk of metal wires.

The present invention provides an organic silicate polymer having superior mechanic property and low dielectric property, a preparation method thereof, a composition for forming an insulation film of a semiconductor device using the same, an insulation film prepared by using the composition, and a semiconductor device comprising the insulation film.

The present invention provides a method for preparing organic silicate polymer comprising: mixing silane compound with organic solvent to prepare a firsts mixture, the silane compound being selected from a group consisting of a) oxidized hydrosilane; b) cyclic siloxane; c) a second mixture of oxidized hydrosilane and silane or silane oligomer; and d) a third mixture of cyclic siloxane and silane or silane oligomer; and hydrolyzing and condensing the first mixture by adding water and catalyst.

The present invention also provides an organic silicate polymer prepared by said method.

The present invention also provides a composition for forming an insulation film of a semiconductor device. The composition comprises organic silicate polymer and organic solvent. The organic silicate polymer is prepared by mixing silane compound with the organic solvent to prepare a first mixture and hydrolyzing and condensing the first mixture by adding water and catalyst. The silane compound is selected from a group consisting of i) oxidized hydrosilane; ii) cyclic siloxane; iii) a second mixture of oxidized hydrosilane and silane or silane oligomer; and iv) a third mixture of cyclic siloxane and silane or silane oligomer.

The present invention also provides a method for preparing an insulation film of a semiconductor device. The method comprises a) mixing silane compound with organic solvent to prepare a first mixture and condensing the first mixture by adding water and catalyst to obtain an organic silicate polymer, the silane compound being selected from a group consisting of i) oxidized hydrosilane; ii) cyclic siloxane; iii) a second mixture of oxidized hydrosilane and silane or silane oligomer; and iv) a third mixture of cyclic siloxane and silane or silane oligomer;

b) dissolving the organic silicate polymer in solvent; c) coating the dissolved organic silicate polymer on a substrate of a semiconductor device; and d) drying and hardening the substrate on which the organic silicate polymer is coated.

The present invention also provides an insulation film of a semiconductor device prepared by said method.

The present invention also provides a semiconductor device comprising the insulation film prepared by said method.

DETAILED DESCRITPION OF PREFERRED EMBODIMENTS

The present invention will now be explained in more detail.

According to exemplary embodiments of the invention, an organic silicate polymer is prepared by mixing silane compound with organic solvent to prepare a first mixture and hydrolyzing and condensing the first mixture by adding water and catalyst. The silane compound is selected from a group consisting of oxidized hydrosilane, cyclic siloxane, a second mixture of oxidized hydrosilane and silane or silane oligomer, and a third mixture of cyclic siloxane and silane or silane oligomer with organic solvent. The organic silicate polymer has superior mechanic property and low dielectric property. Also, an insulation film prepared by the polymer has good insulation property, uniform film thickness, desirable dielectric constant and superior film mechanic property.

The oxidized hydrosilane used for preparing the organic silicate polymer of the present invention is prepared by oxidizing hydrosilane in the presence of water or alcohol.

For the hydrosilane, any organic silane oligomer containing hydrogen can be used. Especially, hydrosilane oligomer represented by the following Chemical Formula 1 or cyclic hydrosilane oligomer represented by the following Chemical Formula 2 is preferable.

$$R^1{}_n Si(OSi)_m H_{(2m-n+4)}$$ [Chemical Formula 1]

In Chemical Formula 1:

$R^1$ is hydrogen, fluorine, aryl, vinyl, allyl, or linear or branched $C_{1-4}$ alkyl substituted or unsubstituted with fluorine;

m is independently an integer of 1 to 20; and n is independently an integer of 1 to 20.

$$H_k \boxed{\quad\text{—SiO—}\quad}_l (R^2)_{2l-k}$$ [Chemical Formula 2]

In Chemical Formula 2:

$R^2$ is hydrogen, fluorine, aryl, vinyl, allyl, or linear or branched $C_{1-4}$ alkyl substituted or unsubstituted with fluorine; and k and l are independently an integer of 3 to 10.

In general, the hydrosilane does not have hydroxy or alkoxy functional group. However, it may have such functional groups.

Catalyst or oxidizing agent can be added to aid the oxidation of the hydrosilane. For the catalyst, metal catalyst like Pd, Pt or Rh can be used, and for the oxidizing agent, peroxide can be used. Any peroxide can be used. Examples of the peroxide are oxiranes like dimethyidioxirane.

The cyclic siloxane used for preparing the organic silicate polymer of the present invention is preferably the compound represented by the following Chemical Formula 3.

$$(R^3)_x \boxed{\quad\text{—SiO—}\quad}_y (OR^4)_{2y-x}$$ [Chemical Formula 3]

In Chemical Formula 3:

$R^3$ is hydrogen, fluorine, aryl, vinyl, allyl, or linear or branched $C_{1-4}$ alkyl substituted or unsubstituted with fluorine;

$R^4$ is hydrogen or linear or branched $C_{1-4}$ alkyl; and x and y are independently an integer of 3 to 10.

For the silane or silane oligomer used for preparing the organic silicate polymer of the present invention, any one comprising silicon, oxygen, carbon and hydrogen can be used. Especially, silanes represented by the following Chemical Formula 4 or Chemical Formula 5 or dimers or oligomers prepared therefrom are preferred.

$$SiR^5{}_p R^6{}_{4-p}$$ [Chemical Formula 4]

In Chemical Formula 4:

$R^5$ is hydrogen, aryl, vinyl, allyl, or linear or branched $C_{1-4}$ alkyl substituted or unsubstituted with fluorine;

$R^6$ is acetoxy, hydroxy, or linear or branched $C_{1-4}$ alkoxy; and p is independently an integer of 0 to 2.

$$R^7{}_q R^8{}_{3-q} Si\text{-}M\text{-}SiR^9{}_r R^{10}{}_{3-r}$$ [Chemical Formula 5]

In Chemical Formula 5:

$R^7$ and $R^9$ are hydrogen, aryl, vinyl, allyl, or linear or branched $C_{1-4}$ alkyl substituted or unsubstituted with fluorine, respectivley;

$R^8$ and $R^{10}$ are acetoxy, hydroxy, or linear or branched $C_{1-4}$ alkoxy;

M is $C_{1-6}$ alkylene or phenylene; and q and r are independently an integer of 0 to 2.

The organic solvent used for preparing the organic silicate polymer of the present invention may comprise a mixture of silane, water and catalyst or any organic solvent as long as the solvent does not restrict hydrolysis and condensation in phase-separated state. Examples of such organic solvent are aliphatic hydrocarbon solvents like n-pentane, i-pentane, n-hexane, i-hexane, 2,2,4-trimethylpentane, cyclohexane or methylcyclohexane; aromatic hydrocarbon solvents like benzene, toluene, xylene, trimethylbenzene, ethylbenzene or methylethylbenzene; alcoholic solvents like methyl alcohol, ethyl alcohol, n-propanol, i-propanol, n-butanol, i-butanol, sec-butanol, t-butanol, 4-methyl 2-pentanoi, cyclohexanol, methylcyclohexanol or glycerol; ketonic solvents like acetone, methyl ethyl ketone, methyl-n-propyl ketone, methyl-n-butyl ketone, methyl-i-butyl ketone, diethyl ketone, cyclohexanone, methylcyclohexanone or acetylacetone ethereal solvents like tetrahydrofuran, 2-methyltetrahydrofuran, ethyl ether, n-propyl ether, i-propyl ether, n-butyl ether, diglyme, dioxin, dimethyidioxin, ethylene glycol monomethyl ether, ethylene glycol monoethyl ether, ethylene glycol-n-propyl ether, ethylene glycol dimethyl ether, ethylene glycol diethyl ether, propyleneglycol monomethyl ether, propyleneglycol monoethyl ether, propyleneglycol monopropyl ether, propyleneglycol dimethyl ether, propyleneglycol diethyl ether or propyleneglycol dipropyl ether; ester solvents like diethyl carbonate, methyl acetate, ethyl acetate, n-propyl acetate, i-propyl acetate, n-butyl acetate, ethyl lactate, ethylene glycol monomethyl ether acetate, ethylene glycol monoethyl ether acetate, propyleneglycol monomethyl ether acetate, propyleneglycol monoethyl ether acetate, propyleneglycol monopropyl ether acetate, ethylene glycol diacetate or propyleneglycol diacetate; and amide solvents like N-methylpyrrolidone, formamide, N-methylformamide, N-ethylformamide, N,N-dimethylformamide, N,N-diethylformamide, N-methylacetamide, N-ethylacetamide, N,N-dimethylacetamide or N,N-diethylacetamide.

The organic solvent is removed after hydrolysis and condensation to obtain the organic silicate polymer in oil or powder state, the organic silicate polymer may be dissolved in the organic solvent and the dissolved organic silicate polymer is coated on a substrate to form a insulation film. Otherwise, the organic silicate polymer is coated on a substrate without being dissolved in the organic solvent after removing the organic solvent (that adversely affects the coating property), water and reaction byproducts. The organic solvent can be used alone or in combination.

The catalyst used for prearpring the organic silicate polymer of the present invention promotes hydrolysis and condensation of the silane or silane oligomer.

For the catalyst, acid catalyst or alkali catalyst can be used. The acid catalyst is not particularly restricted. For example, hydrochloric acid, nitric acid, sulfuric acid, phosphoric acid, fluoric acid, formic acid, acetic acid, propionic acid, butanoic acid, pentanoic acid, hexanoic acid, monochloroacetic acid, dichloroacetic acid, trichloroacetic acid, trifluoroacetic acid, oxalic acid, malonic acid, sulfonic acid, phthalic acid, fumaric acid, citric acid, maleic acid, oleic acid, methylmalonic acid, adipic acid, p-aminobenzoic acid or p-toluenesulfonic acid can be used. The alkali catalyst is not particularly restricted. However, in case the formed insulation film is used for semiconductor devices, the alkali catalyst that does not contain metal ions like sodium or potassium is preferable. It is because the metal ions may adversely affect the semiconductor devices. Ammonia water or organic amine is preferable. Also, in case inorganic base is used, a composition for forming an insulation film that does not contain metal ions is used. The acid catalyst or alkali catalyst can be used alone or in combination.

An amount of the catalyst is different depending on the reaction condition. Preferably, about 0.000001 mol to about 2 mol is used for about 1 mol of silane or silane oligomer. If the amount of the catalyst exceeds about 2 mol, the reaction proceeds too fast even at low concentration, thereby making molecular weight control difficult and causing gel formation.

The composition can be hydrolyzed and condensed gradually using acid catalyst or alkali catalyst. For example, the composition may be hydrolyzed and condensed using acid, and then reacted with base. The composition may be hydrolyzed and condensed using base, and then reacted with acid. Also, the composition can be reacted with the acid catalyst and the alkali catalyst respectively, and the condensate can be mixed.

The reaction temperature of hydrolysis and condensation is not particularly limited. However, about 0° C. to about 100° C. is preferable, and about 15° C. to about 80° C. is more preferable.

The polystyrene-converted weight average molecular weight of the prepared organic silicate polymer is over about 500. When it is used for an insulation film, about 500 to about 1,000,000 of polystyrene-converted weight average molecular weight is preferable.

The present invention also provides a coating composition of an insulation film, which comprises the organic silicate polymer and organic solvent.

The coating composition of an insulation film further comprises organic molecules, organic polymers, dendrimers, etc. to reduce density of the insulation film. The organic material is not limited particularly. A material that can be pyrolyzed in the temperature range of about 200° C. to about 450° C. can be added in the coating composition of an insulation film during or after preparation of the organic silicate polymer.

Also, the coating composition of an insulation film may include additives like pH adjuster, colloidal silica and surfactant additionally.

Total concentration of solid components of the coating composition of an insulation film of the present invention is preferably about 2 wt % to about 60 wt %, and more preferably about 5 wt % to about 40 wt %, considering film thickness and stability of the insulation film. The concentration of solid components can be controlled by the kind and amount of said organic solvents.

The present invention also provides an insulation film prepared by coating the coating composition on a substrate, and drying and hardening the same.

For the substrate, silicon wafer, $SiO_2$ wafer, SiN wafer, compound semiconductor, etc. can be used. And, the insulation film may be formed by spin coating, dipping, roll coating or spraying. Using these coating methods, it is possible to form a film having uniform thickness. Among these coating methods, a spin coating method is preferred when an insulation film for multiple circuits of semiconductor devices is prepared.

Thickness of the insulation film can be controlled by viscosity of the composition and revolution rate of the spin coater. In general, about 0.05 μm to about 2 μm of film thickness is appropriate when it is used for multiple circuits of semiconductor devices.

After coating, an organic silicate polymer insulation film of three-dimensional structure can be formed through drying and hardening processes. Normally, the drying process includes pre-bake and soft-bake processes. During the pre-bake process, the organic solvent is slowly evaporated, and during the soft-bake process, some of the functional groups are cross-linked. During the hardening process, the remaining functional groups are reacted. Preferably, the drying is carried out at about 30° C. to about 350° C., and the hardening is carried out at the temperature over about 350° C. Especially, the hardening temperature is preferred to be carried out in the temperature range of about 350° C. to about 500° C. If the hardening temperature is below about 350° C., the insulation film may be not strong enough due to insufficient condensation of free silicate polymers, and the dielectric property may be poor due to the presence of remaining functional groups. The upper limit of the hardening temperature depends on thermal stability of the organic silicate insulation film of the present invention and semiconductor devices prepared therefrom.

The drying and hardening processes may proceed continuously or intermittently. When the processes proceed intermittently, each of drying and hardening is preferably carried out for about 1 min to about 5 hr. Heating may be performed with a hot plate, oven or furnace in inter gas like nitrogen, argon or helium, in oxygen (e.g., air), in vacuum, or in ammonia- or hydrogen-containing gas. The heating method may be the same or different for the drying process and the hardening process.

After the drying and hardening processes, surface treatment may be carried out to minimize hydroxy groups of the insulation film, if required. The surface treatment can be carried out using a silyl compound like hexamethyl disilazane, alkyl-alkoxy silane or alkyl-acetoxy silane or in reduction gas like hydrogen or in fluorine-containing gas. Silylation of the insulation film can be carried out as follows. The insulation film is dipped or spin-coated with silyl compound, which may be diluted with solvent, or silylated in silyl compound vapor. After silylation, the insulation film may be heated to the temperature of about 100° C. to about 400° C.

The present invention also provides an insulation film that is prepared as above and a semiconductor device comprising the insulation film. The prepared insulation film has superior dielectric property and mechanical strength. So, the insulation film of the invention can be used as an insulation film, a capping layer, a hard mask layer, an etch stop layer and a protection film like a surface coating film of semiconductor devices like LSI, System LSI, DRAM, SDRAM, RDRAM and D-RDRAM, an insulation film of multiple circuit boards, a protection film of liquid crystal display devices and an insulating protection film.

Hereinafter, the present invention is described more in detail through Examples and Comparative Examples. However, the following Examples are only for the understanding of the present invention, and the present invention is not limited to the following Examples.

EXAMPLES

Example 1

(Oxidation of Hydrosilane)

15 g of distilled water, 30 g of tetrahydrofuran and 500mg of Pd/C (10%) powder were mixed in a reaction chamber and the temperature of the chamber was maintained at 0° C. 10 g of tetramethylcyclotetrasiloxane was slowly added to this solution and the reaction chamber was let alone overnight. After the reaction was completed, the solution was filtered to remove the metal catalyst. Then, the organic solvent was removed in vacuum to obtain 19 g of oxidized hydrosiloxane containing 11 g of tetrahydroxy tetramethyl cyclotetrasiloxane.

(Preparation of Organic Silicate Polymer)

8.3 g of the obtained oxidized hydrosiloxane and 12 g of tetrahydrofuran were put in a reaction chamber. 72 mg of hydrogen chloride dissolved in 1.4 g of distilled water was slowly added to the solution. The reaction chamber was heated to 70° C. and let alone overnight. After the reaction was completed, the reaction solution was diluted with ether and washed with distilled water until the pH becomes neutral. Moisture was removed from the organic layer using drying agent. Then, the organic solvent was removed to obtain powdery product.

(Preparation of Insulation Film)

The obtained organic silicate polymer was dissolved in propyleneglycol monomethyl ether acetate. The solution was spin-coated on a silicon wafer to form a thin film. Then, it was hardened at 425° C. for 1 hr under nitrogen atmosphere to obtain an insulation film.

Example 2

(Oxidation of Hydrosilane)

100 g of methanol and 300 mg of Pd/C (10%) powder were mixed in a reaction chamber and the temperature of the chamber was maintained at 0° C. 50 g of tetramethylcyclotetrasiloxane was slowly added to this solution and the reaction chamber was let alone overnight. After the reaction was completed, the solution was filtered to remove the catalyst. Then, the organic solvent was removed in vacuum to obtain 72 g of oxidized hydrosiloxane.

(Preparation of Organic Silicate Polymer)

6.5 g of the obtained oxidized hydrosiloxane, 16 g of tetrahydrofuran and 4.6 g of methanol were put in a reaction chamber. 75 mg of hydrogen chloride dissolved in 6.5 g of distilled water was slowly added to the solution. The reaction chamber was heated to 70° C. and let alone overnight. After the reaction was completed, the reaction solution was diluted with ether and washed with distilled water until the pH becomes neutral. Moisture was removed from the organic layer using drying agent. Then, the organic solvent was removed to obtain powdery product.

(Preparation of Insulation Film)

An insulation film was prepared by the same method of Example 1.

Example 3

(Oxidation of Hydrosilane)

10 g of methyldimethoxysilane, 1.2 g of methanol and 8.36 g of tetrahydrofuran were mixed in a reaction chamber. 34 mg of hydrogen chloride dissolved in 1.4 g of distilled water was slowly added to the solution at 0° C. The reaction chamber was let alone for 12 hr at room temperature. After the reaction was completed, moisture, solvent and acid catalyst were removed to obtain 5.3 g of partially hydrolyzed hydrosilane condensate. 8 g of distilled water, 16 g of tetrahydrofuran and 300 mg of Pd/C (10%) powder were mixed with this hydrolyzed hydrosilane condensate, and let alone overnight. After the reaction was completed, the solution was filtered to remove the catalyst. Then, the organic solvent was removed in vacuum to obtain 8.4 g of oxidation product.

(Preparation of Organic Silicate Polymer)

The obtained oxidation product was dissolved in 30 g of tetrahydrofuran. 108 mg of hydrogen chloride dissolved in 5.3 g of distilled water was slowly added to the solution. The reaction chamber was heated to 70° C. and let alone for 12 hr. After the reaction was completed, the reaction solution was diluted with ether and washed with distilled water until the pH becomes neutral. Moisture was removed from the organic layer using drying agent. Then, the organic solvent was removed in vacuum to obtain powdery product.

(Preparation of Insulation Film)

An insulation film was prepared under the same condition as that of Example 1.

Example 4

(Preparation of Organic Silicate Polymer)

5.1 g (including moisture) of oxidized hydrosiloxane obtained in Example 1, 1.5 g of tetramethoxysilane and 9 g of tetrahydrofuran were put in a reaction chamber. 256 mg of malonic acid dissolved in 2.1 g of distilled water was slowly added to the solution. The reaction chamber was heated to 70° C. and let alone overnight. After the reaction was completed, the reaction solution was diluted with ether and washed with distilled water until the pH becomes neutral. Moisture was removed from the organic layer using drying agent. Then, the organic solvent was removed in vacuum to obtain powdery product.

(Preparation of Insulation Film)

An insulation film was prepared under the same method as that of Example 1.

Comparative Example 1

(Preparation of Organic Silicate Polymer)

10 g of methyltrimethoxysilane and 16.3 g of tetrahydrofuran were put in a reaction chamber. 80 mg of hydrogen chloride dissolved in 7.93 g of distilled water was slowly added to the solution. The reaction chamber was heated to 70°

C. and let alone overnight. After the reaction was completed, the reaction solution was diluted with ether and washed with distilled water until the pH becomes neutral. Moisture was removed from the organic layer using drying agent. Then, the organic solvent was removed in vacuum to obtain powdery product.

(Preparation of Insulation Film)

An insulation film was prepared under the same method as that of Example 1.

Experimental Example 1

Dielectric property and mechanic property of insulation films prepared in Examples 1 to 4 and Comparative Example 1 were determined. The result is shown in Table 1 below.

a) Dielectric property—Dielectric constant was determined according to the MIS (Metal/Insulator/Semiconductor) method.

b) Mechanic property—Elasticity and strength were determined using TriboIndenter of the Hysitron, Inc.

TABLE 1

| Classification | Example 1 | Example 2 | Example 3 | Example 4 | Comp. Example 1 |
|---|---|---|---|---|---|
| Dielectric constant | 2.72 | 2.73 | 2.73 | 2.81 | 2.74 |
| Mechanical property | E = 4.7 Gpa | E = 4.6 Gpa | E = 4.3 Gpa | E = 8.1 Gpa | E = 3.4 Gpa |

As shown in Table 1, insulation films of the present invention (Examples 1 to 4) have lower dielectric constant and superior mechanic property to the insulation film of Comparative Example 1.

Example 5

(Preparation of Organic Silicate Polymer)

4.7 g of tetramethyltetramethoxycyclotetrasiloxane was added to 9 g of tetrahydrofuran in a reaction chamber. 55 mg of hydrogen chloride dissolved in 1.8 g of distilled water was slowly added to the solution. The reaction chamber was let alone overnight at 60° C. After the reaction was completed, the reaction solution was diluted with ether and washed with distilled water until the pH becomes neutral. Moisture was removed from the organic layer using drying agent. Then, the organic solvent was removed in vacuum to obtain powdery product.

(Preparation of Insulation Film)

The obtained organic silicate polymer was dissolved in propyleneglycol monomethyl ether acetate. The solution was spin-coated on a silicon wafer to form a thin film. Then, it was hardened at 425° C. for 1 hr under nitrogen atmosphere to obtain an insulation film.

Example 6

(Preparation of Organic Silicate Polymer)

3.65 g of tetramethyltetramethoxycyclotetrasiloxane and 1.54 g of tetramethoxysilane were added to 9 g of tetrahydrofuran in a reaction chamber. 2.65 mg of malonic acid dissolved in 2.91 g of distilled water was added to the solution, and the reaction chamber was let alone overnight at 60° C. After the reaction was completed, the reaction solution was diluted with ether and washed with distilled water until the pH becomes neutral. Moisture was removed from the organic layer using drying agent. Then, the organic solvent was removed in vacuum to obtain powdery product.

(Preparation of Insulation Film)

An insulation film was prepared by the same method of Example 5.

Comparative Example 2

(Preparation of Organic Silicate Polymer)

6.9 g of methyltrimethoxysilane was added to 9 g of tetrahydrofuran in a reaction chamber. 55 mg of hydrogen chloride dissolved in 5.5 g of distilled water was added to the solution, and the reaction chamber was let alone overnight at 60° C. After the reaction was completed, the reaction solution was diluted with ether and washed with distilled water until the pH becomes neutral. Moisture was removed from the organic layer using drying agent. Then, the organic solvent was removed in vacuum to obtain powdery product.

(Preparation of Insulation Film)

An insulation film was prepared by the same method of Example 5.

Comparative Example 3

(Preparation of Organic Silicate Polymer)

5.5 g of methytrimethoxysilane and 1.54 g of tetramethoxysilane were added to 9 g of tetrahydrofuran in a reaction chamber. 2.63 mg of malonic acid dissolved in 5.8 g of distilled water was added to the solution, and the reaction chamber was let alone overnight at 60° C. After the reaction was completed, the reaction solution was diluted with ether and washed with distilled water until the pH becomes neutral. Moisture was removed from the organic layer using drying agent. Then, the organic solvent was removed in vacuum to obtain powdery product.

(Preparation of Insulation Film)

An insulation film was prepared by the same method of Example 5.

Experimental Example 2

For the insulation films prepared in Examples 5 to 6 and Comparative Examples 2 to 3, dielectric property and mechanic property were examined as in Experimental Example 1. The result is shown in Table 2 below.

TABLE 2

| Classification | Example 5 | Example 6 | Comparative Example 2 | Comparative Example 3 |
|---|---|---|---|---|
| Dielectric constant | 2.73 | 2.81 | 2.74 | 2.80 |
| Mechanical property | E = 4.6 Gpa | E = 7.5 Gpa | E = 3.6 Gpa | E = 6.7 Gpa |

As shown in Table 2, insulation films of the present invention (Examples 5 and 6) have lower dielectric constant and superior mechanic property than those of Comparative Examples 2 and 3.

As described above, when organic silicate polymers of the present invention are used in an insulation film of a semiconductor device, the semiconductor device has higher speed, lower power consumption and reduced cross-talk of metal wires. And, the insulation film including the organic silicate polymer has superior insulating property, uniform film thickness, desirable dielectric constant and superior mechanic property.

While the present invention has been described in detail with reference to the preferred embodiments, those skilled in the art will appreciate that a variety of modifications and substitutions can be made thereto without departing from the spirit and scope of the present invention as set forth in the appended claims.

What is claimed is:

1. A method for preparing an organic silicate polymer, comprising:
   oxidizing hydrosilane oligomer represented by the following Chemical Formula 1 or cyclic hydrosilane oligomer represented by the following Chemical Formula 2 in the presence of water or alcohol to prepare siloxane oligomer;
   mixing the siloxane oligomer or a mixture of the siloxane oligomer and silane or silane oligomer represented by the following Chemical Formula 4 or Chemical Formula 5, respectively, with organic solvent to form a first mixture; and
   hydrolyzing and condensing the first mixture by adding water and catalyst:

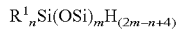   Chemical Formula 1 wherein:
   $R^1$ is hydrogen, fluorine, aryl, vinyl, allyl, or linear or branched $C_{1-4}$ alkyl substituted or unsubstituted with fluorine;
   m is an integer of 1 to 20;
   n is an integer of 1 to 20, and
   (2m−n+4) is an integer of 1 to 43;

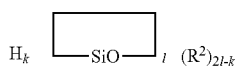   [Chemical Formula 2]

wherein:
   $R^2$ is hydrogen, fluorine, aryl, vinyl, allyl, or linear or branched $C_{1-4}$ alkyl substituted or unsubstituted with fluorine;
   k and l are independently an integer of 3 to 10, and
   (2l−k) is an integer of 1 to 17;

   Chemical Formula 4 wherein:
   $R^5$ is hydrogen, aryl, vinyl, allyl, or linear or branched $C_{1-4}$ alkyl substituted or unsubstituted with fluorine;
   $R^6$ is acetoxy, hydroxy, or linear or branched $C_{1-4}$ alkoxy; and
   P is an integer of 0 to 2;

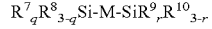   Chemical Formula 5 wherein:
   $R^7$ and $R^9$ are hydrogen, aryl, vinyl, allyl, or linear or branched $C_{1-4}$ alkyl substituted or unsubstituted with fluorine, respectively;
   $R^8$ and $R^{10}$ are acetoxy, hydroxy, or linear or branched $C_{1-4}$ alkoxy, respectively;
   M is $C_{1-6}$ alkylene or phenylene; and
   q and r integers of 0 to 2.

2. The method according to claim 1, wherein the silane or silane oligomer represented by Chemical Formula 4 or Chemical Formula 5 comprises silicon, oxygen, carbon and hydrogen.

3. The method according to claim 1, wherein an amount of the catalyst is between about 0.000001 mol to about 2 mol, based on about 1 mol of the silane compound.

4. The method according to claim 1, wherein hybridizing and condensing the first mixture are performed at a temperature of about 15° C. to about 80° C.

5. The method according to claim 1, wherein oxidizing the hydrosilane oligomer or cyclic oligomer is carried out by adding at least one catalyst or a peroxide oxidizing agent, the catalyst being selected from the group consisting of Pd, Pt and Rh.

* * * * *